United States Patent
Barth et al.

(10) Patent No.: US 7,892,926 B2
(45) Date of Patent: Feb. 22, 2011

(54) FUSE LINK STRUCTURES USING FILM STRESS FOR PROGRAMMING AND METHODS OF MANUFACTURE

(75) Inventors: Karl W. Barth, Poughkeepsie, NY (US); Jeffrey P. Gambino, Westford, VT (US); Tom C. Lee, Essex Junction, VT (US); Kevin S. Petrarca, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/508,962

(22) Filed: Jul. 24, 2009

(65) Prior Publication Data

US 2011/0018091 A1    Jan. 27, 2011

(51) Int. Cl.
*H01L 21/336* (2006.01)
(52) U.S. Cl. .............. 438/281; 438/467; 438/600; 257/E21.592
(58) Field of Classification Search ............ 438/131, 438/132, 215, 281, 333, 467, 600, 601; 257/E21.592
See application file for complete search history.

(56) References Cited

U.S. PATENT DOCUMENTS

| | | | |
|---|---|---|---|
| 5,139,852 A | 8/1992 | Baise et al. | |
| 5,723,898 A | 3/1998 | Gilmour et al. | |
| 6,486,526 B1 | 11/2002 | Narayan et al. | |
| 6,495,918 B1 | 12/2002 | Brintzinger | |
| 6,633,055 B2 | 10/2003 | Bertin et al. | |
| 2001/0005617 A1 | 6/2001 | Feurle et al. | |
| 2001/0054745 A1 | 12/2001 | Tsai | |
| 2002/0017704 A1 | 2/2002 | Yajima | |
| 2002/0113291 A1 | 8/2002 | Adkisson et al. | |
| 2003/0227089 A1 | 12/2003 | Watanabe et al. | |
| 2004/0129938 A1 | 7/2004 | Landers et al. | |
| 2006/0231921 A1 | 10/2006 | Van Kampen et al. | |
| 2008/0179706 A1* | 7/2008 | Kim et al. ................. | 257/529 |

* cited by examiner

*Primary Examiner*—Hoai v Pham
(74) *Attorney, Agent, or Firm*—David Cain; Roberts Mlotkowski Safran & Cole, P.C.

(57) ABSTRACT

A method of forming a programmable fuse structure includes forming at least one shallow trench isolation (STI) in a substrate, forming an e-fuse over the at least one STI and depositing an interlevel dielectric (ILD) layer over the e-fuse. Additionally, the method includes removing at least a portion of the at least one STI under the e-fuse to provide an air gap below a portion of the e-fuse and removing at least a portion of the ILD layer over the e-fuse to provide the air gap above the portion of the e-fuse.

19 Claims, 13 Drawing Sheets

FUSE LINK STRUCTURES USING FILM STRESS FOR PROGRAMMING AND METHODS OF MANUFACTURE

FIELD OF THE INVENTION

The present invention generally relates to structures and methods of manufacture, and more specifically to fuse link structures using film stress for programming and methods of manufacture.

BACKGROUND

Advanced semiconductor circuitry may use various programmable interconnect elements to connect logic blocks for a number of applications, such as electrically programmable feature selection, speed sorting, die identification, and redundancy implementation. For high-speed applications, the on-state of such structures should have a low resistance. To achieve a high density of such structures in an integrated circuit, the programmable elements should be small.

Programmable fuses are an example of a programmable element, wherein, for example, a fuse element, e.g., sacrificial metal lines buried in a dielectric layer in the circuits (which are normally closed) are blown by vaporizing the fuse element with laser energy to open the circuit that is not selected. Electrically programmable fuses may be used, for example, for chip ID, redundancy, and non-volatile memory programming.

Current electronic fuses may use melting and/or evaporation of material for programming. For example, programmable fuses fall into at least three categories depending on the method of programming. The first category includes laser-blown fuses where the programmable fuses are programmed using a laser to burn or sever the conductive portion of the fuse. The second category includes electrically blown fuses where the fuse is programmed by passing current through it sufficient to overload and open or burn out the fuse. The third category includes electrically blown anti-fuses, where the fuse is programmed with an electric current, which reduces the resistance across the fuse.

However, the damage associated with these processes may affect neighboring devices, and degrade functionality. For example, in all of these methods of fuse programming, the area surrounding the fuse may be damaged during the programming process due to the heat involved in the programming step. Thus the fuses may require sufficient space between one another on a wafer so that the programming of one fuse does not damage adjacent fuses. However, such configurations reduce a fuse density.

More specifically, laser fusing may produce damage to the area surrounding the fused element, which is traded off for fuse blow yield. Another problem with laser fusing is that it requires a large on-chip area to handle laser power capability as well as "line-of-sight" for laser access (which is a component of the area penalty of the laser fusing process). Additionally, excessive laser energy can cause silicon substrate damage or massive crater formation that impacts neighboring links. Such problems with laser fusing are not necessarily mitigated by traditional electrically blown fuses because electrically blown fuses typically require a larger voltage than is conveniently available on the chip.

Additionally, current electronic fuses (e.g., electrically blown fuses) use silicided polysilicon (from the gate stack), wherein programming is achieved by agglomerating the silicide by passing a high current through the fuse. However, one problem with this approach is that metal gates are now being used in advanced devices, so a new electronic fuse structure is required. That is, a electrical programming method and structure is needed which is compatible with metal gates, while minimizing damage to neighboring structures.

Accordingly, there exists a need in the art to overcome the deficiencies and limitations described hereinabove.

SUMMARY

In a first aspect of the invention, a method of forming a programmable fuse structure comprises forming at least one shallow trench isolation (STI) in a substrate, forming an e-fuse over the at least one STI and depositing an interlevel dielectric (ILD) layer over the e-fuse. Additionally, the method comprises removing at least a portion of the at least one STI under the e-fuse to provide an air gap below a portion of the e-fuse and removing at least a portion of the ILD layer over the e-fuse to provide the air gap above the portion of the e-fuse.

An additional aspect of the invention includes a method of manufacturing a programmable fuse comprising forming at least one shallow trench isolation (STI) in a substrate, forming an e-fuse over the at least one STI and depositing an interlevel dielectric (ILD) layer over the e-fuse. Additionally, the method comprises removing at least a portion of the ILD layer over the e-fuse to provide an air gap above a portion of the e-fuse and removing at least a portion of the at least one STI under the e-fuse to provide the air gap below the portion of the e-fuse. Furthermore, the method comprises providing a metal layer above the ILD layer and contacts in the ILD layer electrically connecting the metal layer and the e-fuse.

In an additional aspect of the invention, a programmable fuse structure comprises a substrate, at least one shallow trench isolation (STI) formed in the substrate and an e-fuse formed over the at least one STI. Additionally the programmable fuse structure comprises an interlevel dielectric (ILD) layer over the e-fuse. At least a portion of the ILD layer over the e-fuse is removed to provide an air gap above a portion of the e-fuse and at least a portion of the at least one STI under the e-fuse is removed to provide the air gap below the portion of the e-fuse. Additionally, the programmable fuse structure comprises a multi-layer material stack comprising coefficient of thermal expansion (CTE) mismatches.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention generally relates to structures and methods of manufacture, and more specifically to fuse link structures using film stress for programming and methods of manufacture. In embodiments, the present invention uses thermal strain to program a fuse element (e.g., a conducting wire, wire and via, and/or wire and contact). In embodiments, the fuse element is surrounded by an air-gap. Additionally, in further embodiments, the fuse element is partially surrounded by an air-gap. By implementing the present invention, electrical programming methods and structures are provided which are compatible with metal gates.

According to aspects of the invention, providing the air-gap: (1) increases the heating rate of the fuse during programming (e.g., due to poor thermal conductivity); (2) minimizes heating of neighboring structures; and (3) minimizes the mechanical constraint of the fuse structure, so that cracks are easily formed during programming in the fuse structure (e.g., wires, vias, contacts and/or associated interfaces).

With the present invention, fuse programming occurs through mechanical rupture of the fuse element as a result of thermal coefficient of expansion mismatches of a multi-layer material stack. Thus, by implementing the present invention, the mechanical rupture programming method reduces the possibility of healing and/or shorting by electromigration, melting and/or phase changes, which occur with, for example, laser-blown fuses.

Additionally, utilizing a fuse structure surrounded by an air gap allows for lower energy programming and a quicker rate of programming (both of which will reduce programming costs), while minimizing damage to neighboring structures. Furthermore, the air gap minimizes the mechanical constraint of the fuse structure, so that cracks may be more easily formed during programming in the fuse structure, which will also reduce fuse programming costs.

Figure 1:
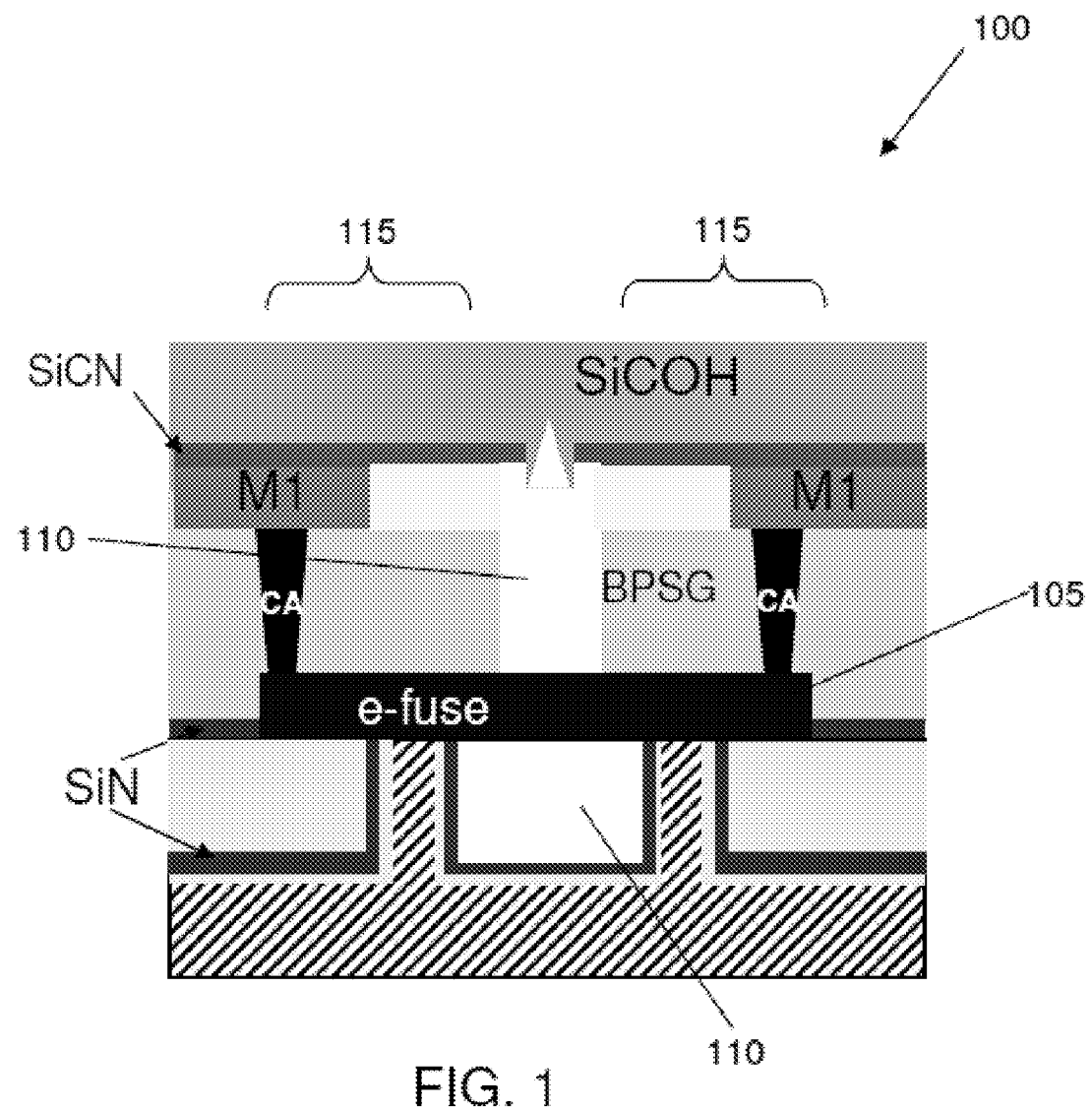
FIG. 1 shows a sectional view of an exemplary structure in accordance with aspects of the invention.

FIG. 1 shows a fuse structure 100 in accordance with aspects of the invention, and FIGS. 2-7 show intermediate structures and processing steps used to form the fuse structure 100 of FIG. 1. As shown in FIG. 1 the structure 100 includes an electronic fuse (e-fuse) 105, which is surrounded by an air gap 110. In embodiments, the e-fuse 105 may be a metal gate stack, a metallic conductor and/or semiconductor. Moreover, as shown in FIG. 1, the e-fuse 105 is surrounded by the air gap 110 towards the center region of the e-fuse 105. However, as further shown in FIG. 1, the e-fuse 105 is constrained by mechanical anchors 115 towards the end regions of the e-fuse 105. By providing the fuse structure 100 having the air gap 110, heat in the region of the e-fuse 105 is more concentrated, e.g., due to poor thermal conductivity. Moreover, providing the air gap 110 and the mechanical anchors 115 allows for bending fracture of the e-fuse 105.

Figure 2:
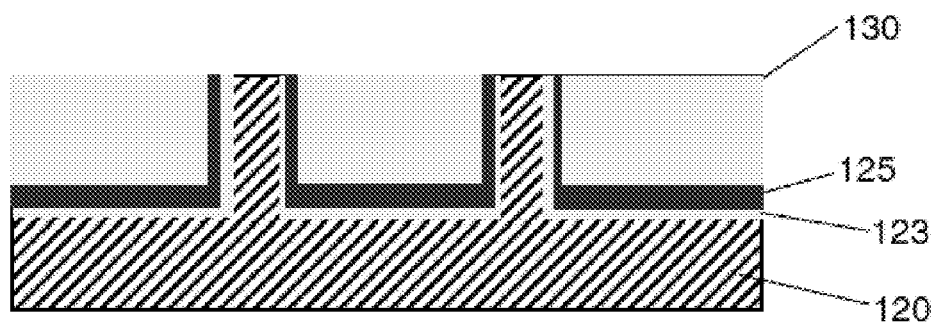
FIGS. 2-7 show exemplary processing steps and related structures used to form the exemplary structure shown in FIG. 1 in accordance with aspects of the invention.

FIG. 2 shows an intermediate structure and processing steps used to form the structure 100 of FIG. 1. As shown in FIG. 2, a substrate 120, e.g., a silicon substrate, is provided. Using conventional lithographic and etching processes, trenches (not labeled) are formed in the substrate 120. An insulation layer, e.g., $SiO_2$ layer 123, is deposited in the trenches using conventional deposition techniques well understood by those of ordinary skill in the art. In embodiments, the $SiO_2$ layer 123 may be approximately 10 nm in thickness, with other thicknesses contemplated by the invention. Additionally, a mechanical hard layer, e.g., a silicon nitride (SiN) layer 125, is deposited in the trenches on the $SiO_2$ layer 123 using conventional deposition techniques well understood by those of ordinary skill in the art, such as, for example, CVD. The mechanical hard layer may be used to absorb the stress relaxation, which may occur as a result of the fuse programming.

Furthermore, as shown in FIG. 2, a low temperature oxide (LTO), e.g., a layer of silicon dioxide ($SiO_2$) 130, is deposited in the trenches above the SiN layer 125 using conventional deposition techniques well understood by those of ordinary skill in the art, to form shallow trench isolations (STIs) (not labeled) comprising the $SiO_2$ layer 130, the SiN layer 125 and $SiO_2$ layer 123. The $SiO_2$ layer 130, the SiN layer 125 and $SiO_2$ layer 123 are planarized using conventional polishing techniques well understood by those of ordinary skill in the art, e.g., a chemical-mechanical polish (CMP) process.

Figure 3:
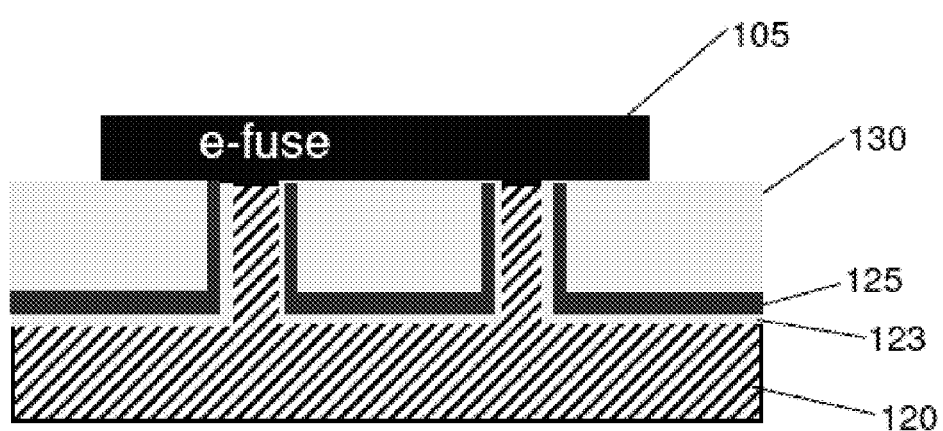

As shown in FIG. 3, a gate conductor layer (a portion of which will become the e-fuse 105) is formed above the substrate 120, portions of the $SiO_2$ layer 123, the SiN layer 125 and the $SiO_2$ layer 130. In embodiments, the gate conductor layer (a portion of which will become the e-fuse 105) may comprise polysilicon, titanium, tantalum, tungsten, tantalum nitride, platinum silicide and/or cobalt silicide, amongst other suitable materials. In embodiments, a gate dielectric layer (not shown) may be formed underneath the gate conducting layer (a portion of which will become the e-fuse 105) prior to depositing the gate conductor layer.

Conventional lithographic and etching processes, e.g., a reactive ion etch (RIE), are used to pattern the gate conductor layer to form the e-fuse 105 (which, as would be understood by those of ordinary skill in the art, is also the gate conductor). Additionally, spacers, junctions and a silicide are formed in respective conventional manners.

Figure 4:
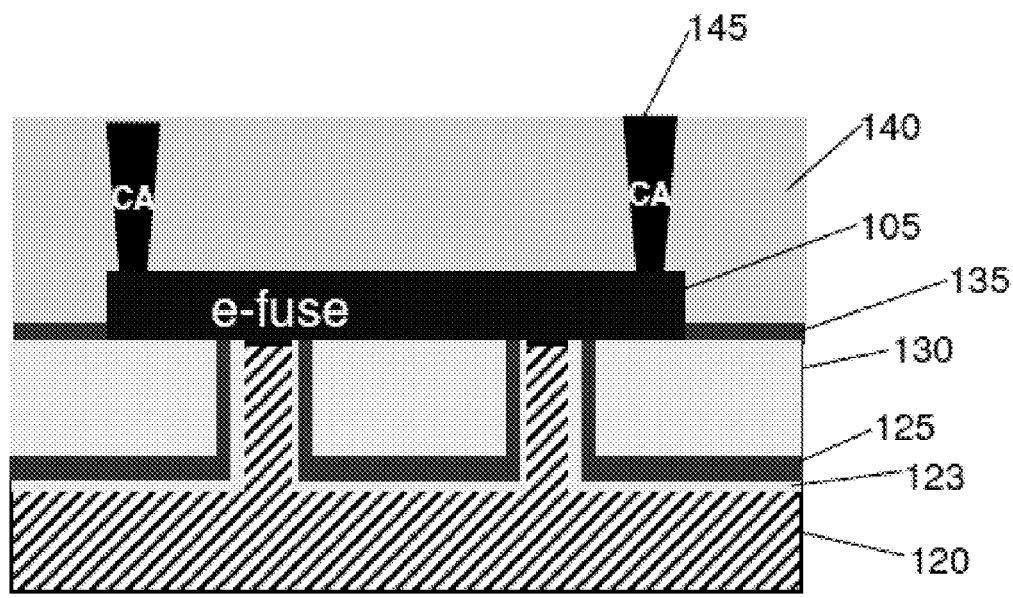

As shown in FIG. 4, a dielectric layer, e.g., a SiN layer 135, is deposited on portions of the $SiO_2$ layer 123, the SiN layer 125, the $SiO_2$ layer 130 and the substrate 120 not covered by the e-fuse 105. Additionally, an interlevel dielectric layer, e.g., a borophosphosilicate glass (BPSG) layer 140, is deposited over the $SiO_2$ layer 130 and the e-fuse 105. Contact holes (not labeled) are formed in the BPSG layer 140 down to the e-fuse 105 using conventional photolithography and etching processes (e.g., an RIE). Contacts 145 are filled with metal in contact with the e-fuse 105. In embodiments, the contacts 145 may comprise Ti, TiN or W, amongst other suitable materials. As additionally shown in FIG. 4, the contacts 145 and the BPSG layer 140 are planarized using conventional methods, e.g., a CMP.

Figure 5:
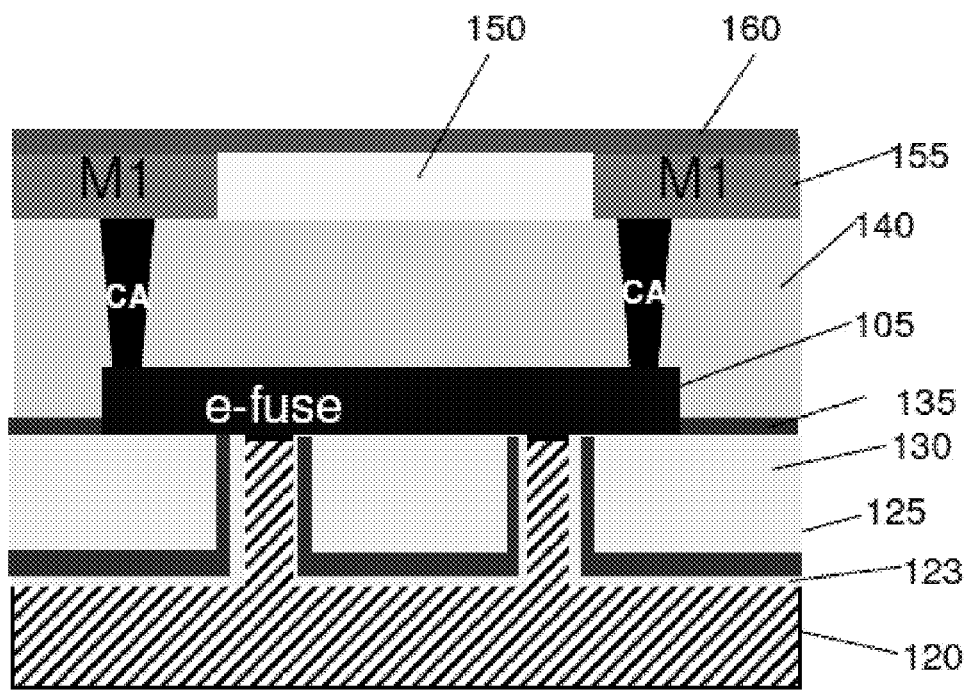

As shown in FIG. 5, an $SiO_2$ layer 150 is deposited on the BPSG layer 140 and the contacts 145 using conventional deposition methods, e.g., a plasma enhanced chemical vapor deposition (PECVD). The $SiO_2$ layer 150 is etched using conventional photolithography and etching processes, e.g., RIE, to form trenches (not labeled), in which the M1 layer 155 is deposited. The invention contemplates that, in embodiments, a carbon doped $SiO_2$ layer, e.g., SiCOH, or BPSG may be used in place of the $SiO_2$ layer 150. Subsequently, the M1 layer 155 is deposited in the trenches, as shown in FIG. 5. In embodiments, the M1 layer may comprise Ta and/or Cu, amongst other materials. A cap layer 160, e.g., a SiCN (as illustrated in FIG. 5) or SiN layer is deposited over the M1 layer 155 and the $SiO_2$ layer 150 using conventional deposition processes (e.g., a PECVD).

Figure 6:
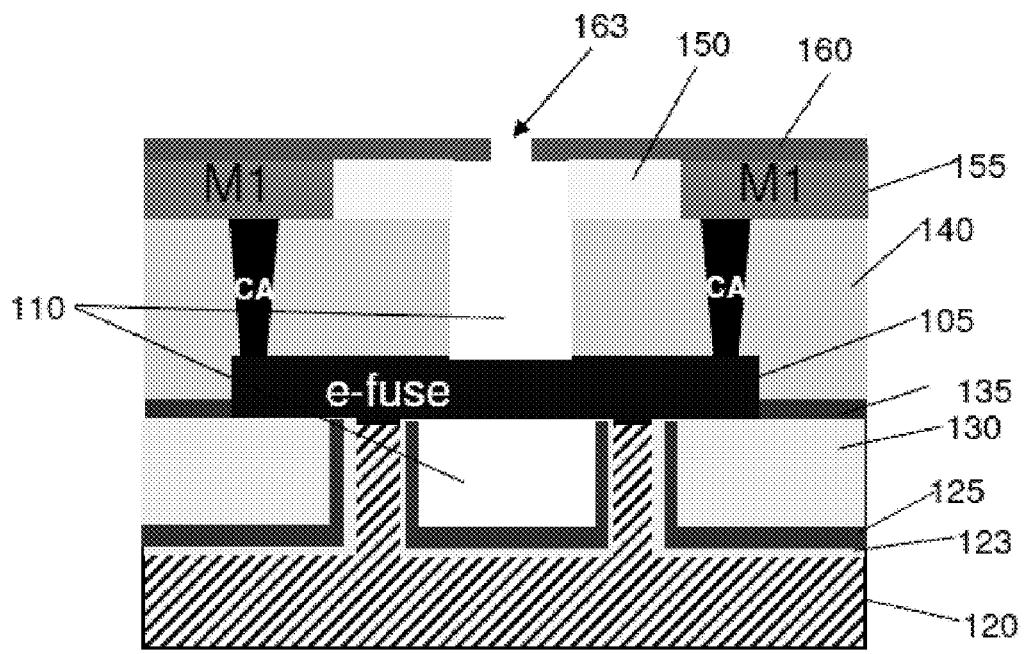

As shown in FIG. 6, the air gap 110 is formed around the e-fuse 105. More specifically, conventional lithography and etching processes (e.g., a masking process and an RIE) are used to provide an opening 163 in the cap layer 160, as shown in FIG. 6. Further, an isotropic etch (e.g., BHF+CH$_4$/O$_2$+BHF) is used to etch portions of the SiO$_2$ layer 150, portions of the BPSG layer 140, portions of the SiN layer 135 and portions of the SiO$_2$ layer 130 to form the air gap 110. While the intermediate fuse structure is illustrated in FIG. 6 with the SiN layer 125 and the SiO$_2$ layer 123 remaining after the etching of the STI, in embodiments, the SiN layer 125 and the SiO$_2$ layer 123 may also be removed. As should be understood by those of ordinary skill in the art, the substrate 120 provides an etch stop when removing the SiO$_2$ layer 130, the SiN layer 125 and the SiO$_2$ layer 123 to form the air gap.

Figure 7:
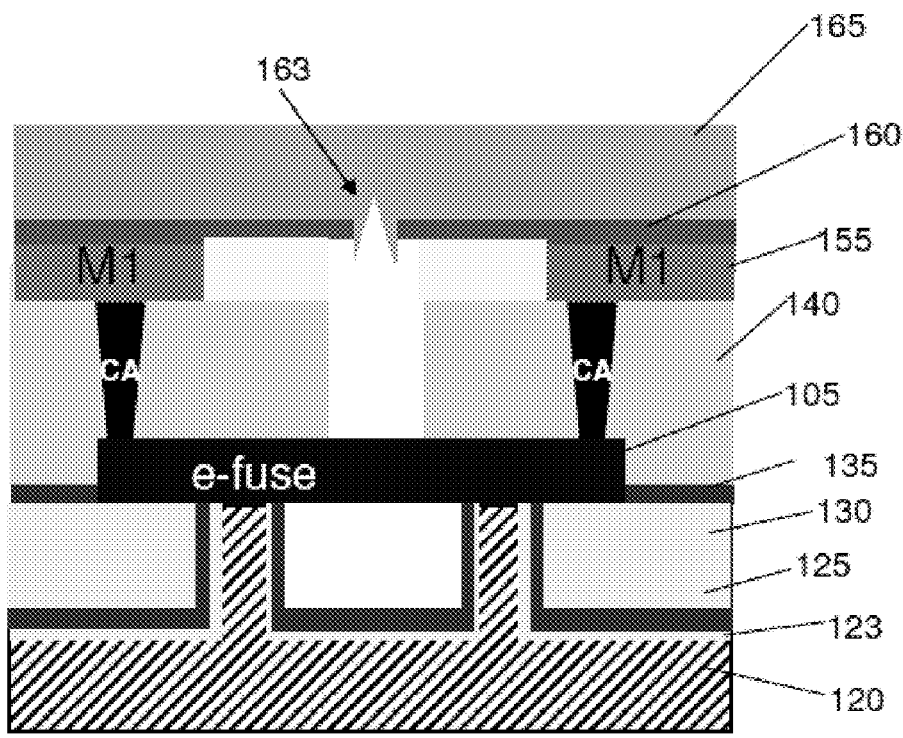

As shown in FIG. 7, an interlevel dielectric layer 165 is deposited (e.g., a non-conformal deposition) on the cap layer 160 and partially within the opening 165 using a PECVD process. In embodiments, the interlevel dielectric layer 165 may comprise SiCOH (as illustrated in FIG. 7), SiO$_2$, a low-k material or an ultra low-k material. As shown in FIG. 7, the now-covered opening 163 may be small, which renders the deposition of the SiCOH layer 165 easier, as compared to a larger opening.

Figure 8:
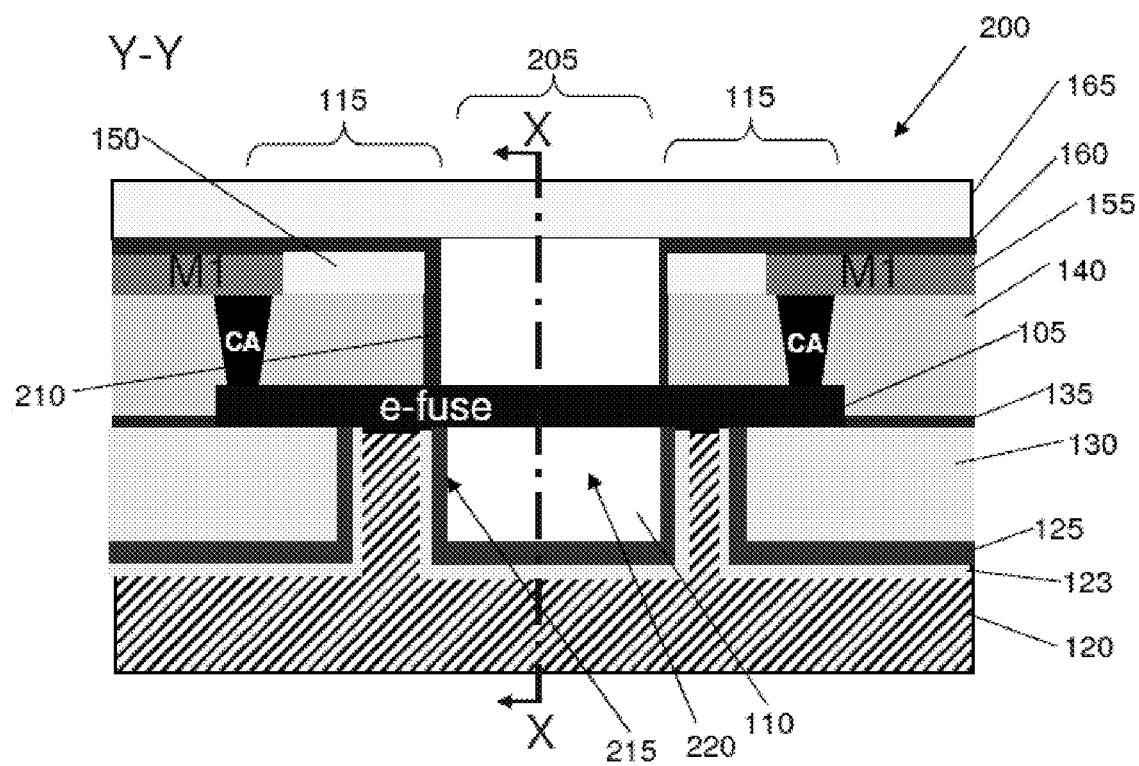
FIGS. 8 and 9 show sectional views of an exemplary structure in accordance with additional aspects of the invention.
Figure 9:
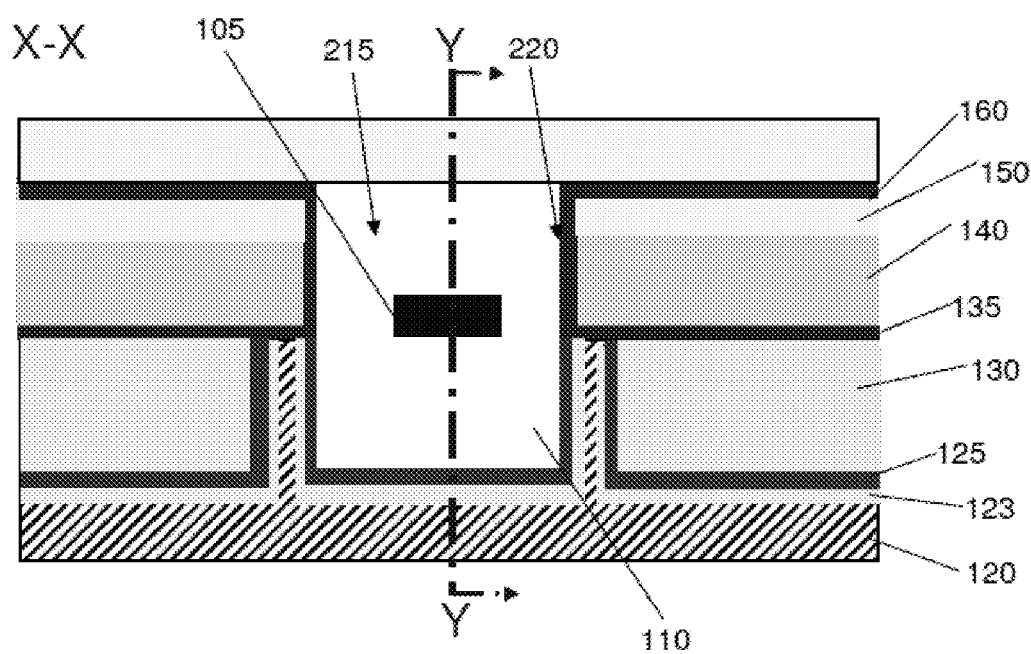

FIGS. 8 and 9 show sectional views X-X and Y-Y of a fuse structure 200 in accordance with additional aspects of the invention. As shown in FIG. 8, the fuse structure 200 includes an electronic fuse (e-fuse) 105, which is surrounded by an air gap 110. In embodiments, the e-fuse 105 may be a metal gate stack, a metallic conductor and/or semiconductor. Moreover, as shown in FIG. 8, the e-fuse 105 is surrounded by the air gap 110 towards the center region of the e-fuse 105. However, as further shown in FIG. 8, the e-fuse 105 is constrained by mechanical anchors 115 towards the end regions of the e-fuse 105. By providing the fuse structure 200 with the air gap 110, heat in the region of the e-fuse 105 is more concentrated, e.g., due to poor thermal conductivity. Moreover, providing the air gap 110 and the mechanical anchors 115 allows for bending fracture of the e-fuse 105. In comparison to the fuse structure 100 of FIG. 1, the fuse structure 200 of FIG. 8 has a larger air gap 110, and more specifically has a larger air gap 110 above the e-fuse 105.

As shown in FIG. 9, the e-fuse 105 is surrounded by the air gap 110. Moreover, as should be understood by those of ordinary skill in the art, in order to illustrate the sectional view of FIG. 9, the portions of the SiN layer 125, the SiN layer 135, the SiN layer 210 and cap layer 160 on sidewall 215 (as indicated in FIGS. 8 and 9) are not shown. Likewise, as should be understood by those of ordinary skill in the art, in order to illustrate the sectional view of FIG. 8, the portions of the SiN layer 125, the SiN layer 210 and cap layer 160 on sidewall 220 (as indicated in FIGS. 8 and 9) are not shown.

Still referring to FIG. 8, the fuse structure 200 may be formed using processing steps (and resulting in intermediate structures) as shown in FIGS. 2-5, described above. Thus, as shown in FIG. 5, a cap layer 160 has been deposited over the M1 layer 155 and the SiO$_2$ layer 150. However, instead of providing a narrower opening 165 in the cap layer 160 as shown in FIG. 6, with fuse structure 200, a larger opening 205 is etched in the cap layer 160 using conventional lithography and etching processes. As shown in FIG. 8, a portion of the SiO$_2$ layer 150, a portion of the BPSG layer 140 and a portion of the SiO$_2$ layer 130 are removed using conventional masking and etching processes (e.g., using an HF acid etchant) down to the SiN layer 125 to form the air-gap 110. Additionally, in embodiments, the forming of the air gap 110 may include a removal of the SiN layer 125 and the SiO$_2$ layer 123, such that the air gap 110 extends to the substrate 120.

As should be understood by those ordinarily skilled in the art, the etchant should be selected such that portions of the SiO$_2$ layer 150, the portion of the BPSG layer 140 and the portion of the SiO$_2$ layer 130 are removed while the e-fuse 105 remains intact. Moreover, while the etching of the portion of the SiO$_2$ layer 150, the portion of the BPSG layer 140 and the portion of the SiO$_2$ layer 130 are described as being etched in a single etching step using a single etchant, as should be understood by those ordinarily skilled in the art, the portion of the SiO$_2$ layer 150 may be etched first by, e.g., a first etchant, the portion of the BPSG layer 140 may be etched next, e.g., using a second etchant, followed by an etching of the SiO$_2$ layer 130, e.g., using a third etchant (which may be same as the first etchant).

Following the removal of the respective portions of the SiO$_2$ layer 150, the BPSG layer 140 and the SiO$_2$ layer 130, an optional mechanical hard layer 210, for example, a stressed nitride, e.g., SiN, may be deposited on the sidewalls of the BPSG layer 140 and the SiO$_2$ layer 150, as shown in FIG. 8. In comparison, the exemplary fuse structure 100 of FIG. 7 does not include an optional mechanical hard layer on the sidewalls of the BPSG layer 140 and the SiO$_2$ layer 150.

As further shown in FIG. 8, an interlevel dielectric layer 165 is deposited on the cap layer 160 and partially within and/or over the opening 205 using, e.g., a PECVD process. In embodiments, the interlevel dielectric layer 165 may comprise SiCOH, SiO$_2$, a low-k material or an ultra low-k material. As shown in FIG. 8, the opening 205 is larger (as compared to the embodiment shown in FIG. 7), which may allow the portions of the SiO$_2$ layer 150, the portions of the BPSG layer 140 and the portions of the SiO$_2$ layer 130 to more easily be removed.

While not illustrated in FIGS. 8 and 9, the invention contemplates that the STIs (not labeled) may comprise only the SiO$_2$ layer 130 without the SiN layer 125 and SiO$_2$ layer 123. Additionally, the invention contemplates that the STIs may be formed such that they are immediately adjacent the air gap 110 (or an SiO$_2$/SiN liner of the air gap 110) without any portion of the substrate 120 intervening there between. However, with embodiments wherein the STIs are formed immediately adjacent the air gap 110 with no portion of the substrate 120 intervening there between, the substrate 120 will not provide an etch stop when removing portions of the SiO$_2$ layer 130. Furthermore, while the STIs are illustrated as SiO$_2$, in embodiments, the STI may comprise another dielectric material or a junction with a reverse diode.

Figure 10:
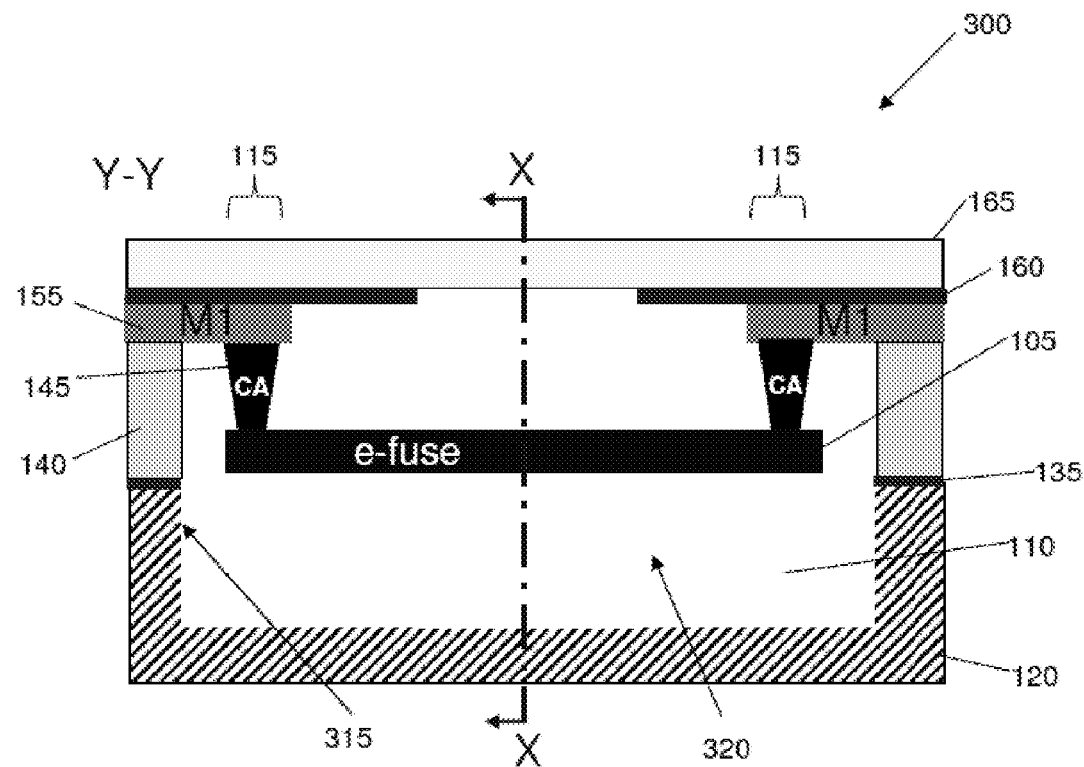
FIGS. 10 and 11 show sectional views of an exemplary structure in accordance with additional aspects of the invention.
Figure 11:
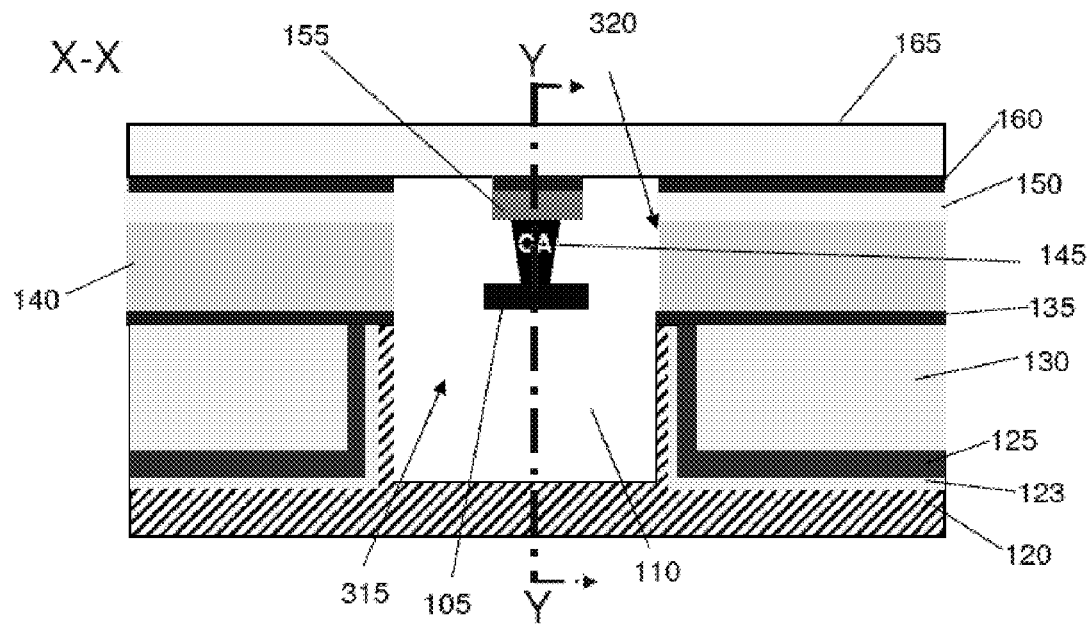

FIGS. 10 and 11 show sectional views X-X and Y-Y of an exemplary fuse structure 300 in accordance with further aspects of the invention, and FIGS. 12-16 show intermediate structures and processes used to form the fuse structure 300. As shown in FIG. 10, with the fuse structure 300, the air gap 110 is formed larger (as compared to exemplary fuse structure 100 and exemplary fuse structure 200), such that the e-fuse 105 is entirely unsupported but for the e-fuse's connections to the contacts 145. As such, with fuse structure 300, the mechanical anchors 115 towards the end regions of the e-fuse 105 comprise the contacts 145.

As shown in FIG. 11, the e-fuse 105 is surrounded by the air gap 110. Moreover, as should be understood by those of ordinary skill in the art, in order to illustrate the sectional view of FIG. 11 more clearly, the portions of the substrate 120, the SiN layer 135; the BPSG layer 140, the SiO$_2$ layer 150 and the cap layer 160 on sidewall 315 (as indicated in FIGS. 10 and 11) are not shown. Likewise, as should be understood by those of ordinary skill in the art, in order to illustrate the sectional view of FIG. 10 more clearly, the portions of the substrate 120, the SiN layer 135, the BPSG layer 140, the SiO₂ layer 150 and the cap layer 160 on sidewall 320 (as indicated in FIGS. 10 and 11) are not shown.

Figure 12:
FIGS. 12-16 show exemplary processing steps and related structures used to form the exemplary structure shown in FIGS. 10 and 11 in accordance with aspects of the invention.

FIG. 12 shows an intermediate structure and processing steps used to form exemplary fuse structure 300 in accordance with aspects of the invention. As shown in FIG. 12, a substrate 120, e.g., a silicon substrate, is provided. Using conventional lithographic and etching processes, a trench (not labeled) is formed in the substrate 120. In embodiments, an SiO₂ layer 123 is deposited in the trench using conventional deposition techniques. A mechanical hard layer 125, e.g., silicon nitride (SiN), may be deposited in the trench on the SiO₂ layer 123 using conventional deposition techniques.

Additionally, as shown in FIG. 12, a layer of silicon dioxide (SiO₂) 130 is deposited in the trench above the SiN layer 125 using conventional deposition techniques well understood by those of ordinary skill in the art to form a shallow trench isolation (STI) (not labeled) comprising the SiO₂ layer 130, the SiN layer 125 and the SiO₂ layer 123. However, in embodiments, the invention contemplates that the STIs are formed of only SiO₂ layer 130 without the SiO₂ layer 123 and the SiN layer 125. As further shown in FIG. 12, the SiO₂ layer 130, the SiN layer 125 and the SiO₂ layer 123 are planarized using conventional polishing techniques well understood by those of ordinary skill in the art, e.g., a chemical-mechanical polish (CMP) process.

FIG. 12 further shows a gate conductor layer (a portion of which will become the e-fuse 105) formed above the substrate 120 and the SiO₂ layer 130. Conventional lithographic and etching processes, e.g., a reactive ion etch (RIE), are used to pattern the gate conductor layer to form the e-fuse 105 (which, as would be understood by those of ordinary skill in the art, is also the gate conductor). Additionally, spacers, junctions and a silicide are formed in respective conventional manners well understood by those of ordinary skill in the art. Further, as shown in FIG. 12, a SiN layer 135 is deposited on portions of the SiO₂ layer 130, portions of the SiN layer 125, portions of the SiO₂ layer 123 and the substrate 120 not covered by the e-fuse 105 using conventional lithography and deposition processes (e.g., using a mask to cover the e-fuse 105 and/or using a selective deposition).

Figure 13:
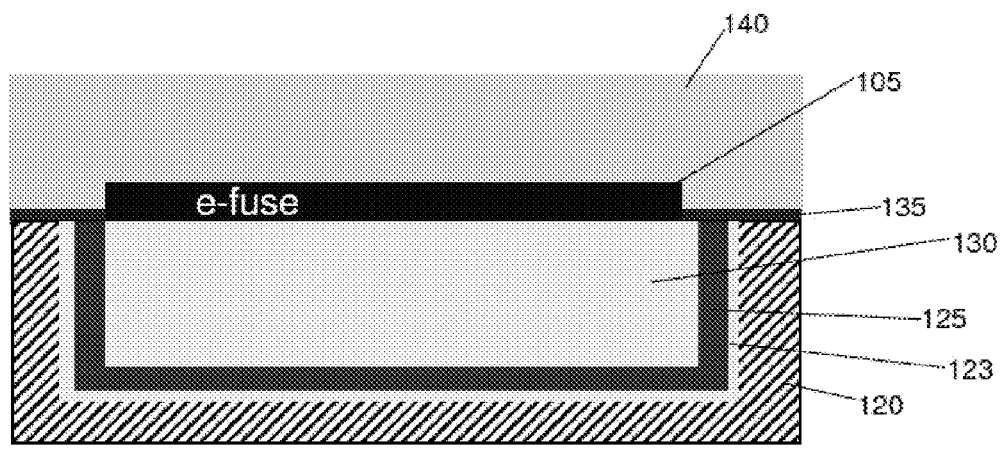

FIG. 13 shows an intermediate structure and additional processing steps in accordance with aspects of the invention. As shown in FIG. 13, an ILD layer, e.g., a borophosphosilicate glass (BPSG) layer 140, is deposited over the SiN layer 135 and the e-fuse 105, using a conventional deposition process.

Figure 14:
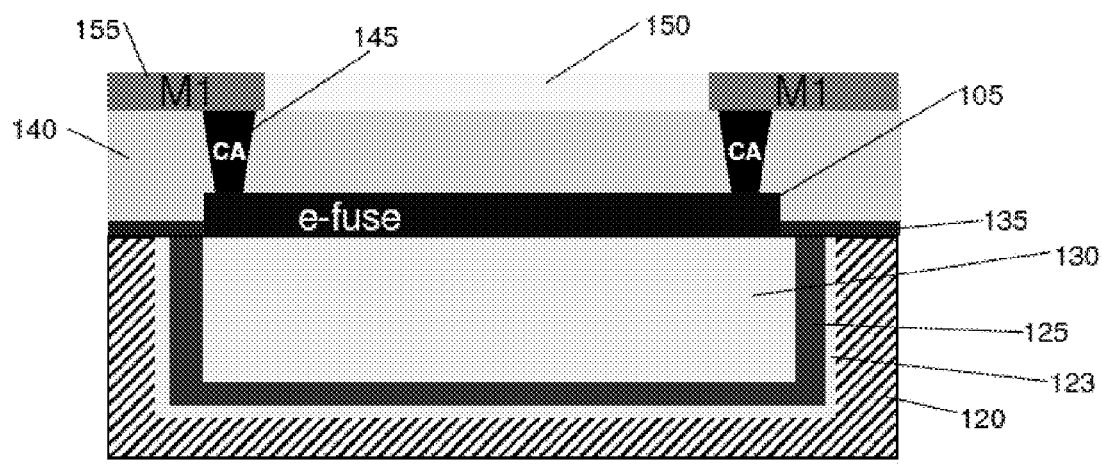

As shown in FIG. 14, contact holes (not labeled) are formed in the BPSG layer 140 down to the e-fuse 105 using conventional photolithography and etching processes (e.g., an RIE). Contacts 145 are deposited in the contact holes in contact with the e-fuse 105. In embodiments, the contacts 145 may comprise Ti, TiN or W, amongst other suitable materials. As additionally shown in FIG. 14, the contacts 145 are planarized using conventional methods, e.g., CMP. An SiO₂ layer 150 is deposited on the BPSG layer 140 and the contacts 145 using a conventional deposition method, e.g., a plasma enhanced chemical vapor deposition (PECVD). The SiO₂ layer 150 is etched using conventional photolithography and etching processes, e.g., RIE, to form trenches (not labeled), in which the M1 layer 155 is deposited. The invention contemplates that, in embodiments, a carbon doped SiO₂ layer, e.g., SiCOH, or BPSG may be used in place of the SiO₂ layer 150. Subsequently, the M1 layer 155 is deposited in the trenches, as shown in FIG. 14. In embodiments, the M1 layer may comprise Ta and/or Cu, amongst other suitable materials.

Figure 15:
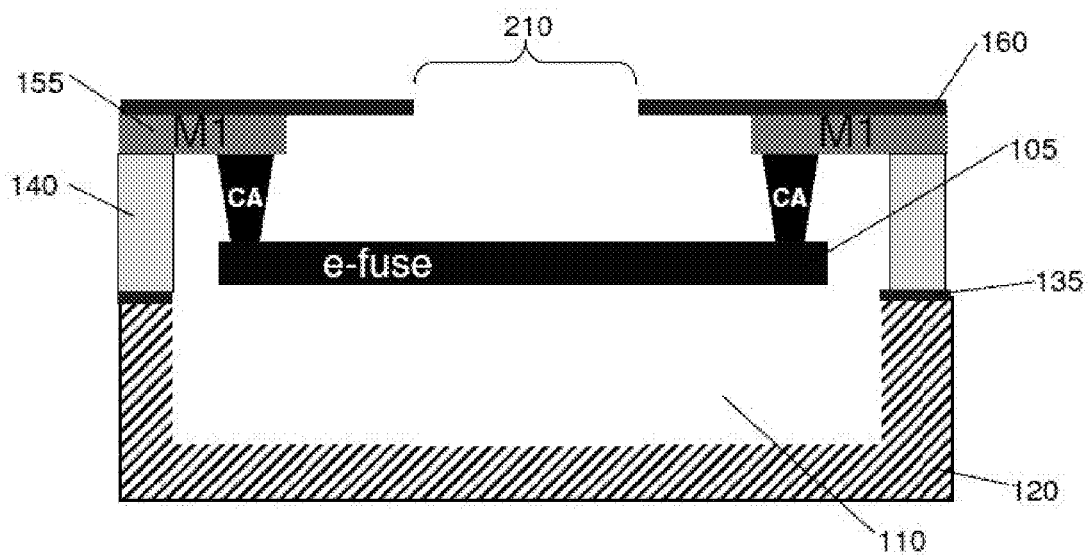

As shown in FIG. 15, a cap layer 160, e.g., a SiCN or SiN layer is deposited over the M1 layer 155 and the SiO₂ layer 150 using conventional deposition processes (e.g., a PECVD). Additionally, an air gap 110 is formed around the e-fuse 105. More specifically, conventional lithography and etching processes (e.g., a masking process and an RIE) are used to provide an opening 210 in the cap layer 160. Further, an isotropic etch (e.g., BHF+CH₄/O₂+BHF) is used to etch the SiO₂ layer 150, portions of the BPSG layer 140, portions of the SiN layer 135, the SiO₂ layer 130, the SiN layer 125 and the SiO₂ layer 123 to form the air gap 110. With an isotropic etch (e.g., using dilute HF), the BPSG layer 140 will be etched at a much higher rate than the SiN layer 160 and the M1 layer 155. As noted above, while the etching to form the air gap 110 has been described as a single etch, those ordinarily skilled in the art will readily understand that more than one etch and/or more than one etchant may be used to form the air gap 110. Additionally, while not illustrated in FIG. 15, in embodiments, SiN layer 125 and the SiO₂ layer 123 may not be etched, such that the SiN layer 125 and the SiO₂ layer 123 remain.

Figure 16:
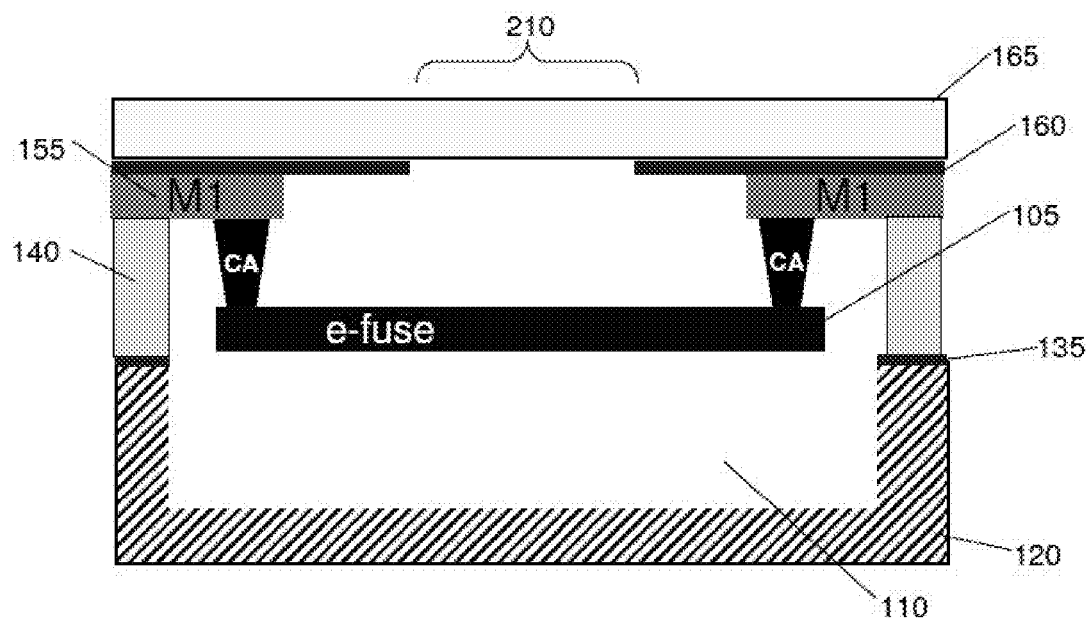

FIG. 16 shows additional processing steps and a final structure in accordance with aspects of the invention. As shown in FIG. 16, an interlevel dielectric layer 165 is deposited on the cap layer 160 and covering the opening 210 using, e.g., a PECVD process. In embodiments, the interlevel dielectric layer 165 may comprise SiCOH, SiO₂, a low-k material or an ultra low-k material.

Figure 17:
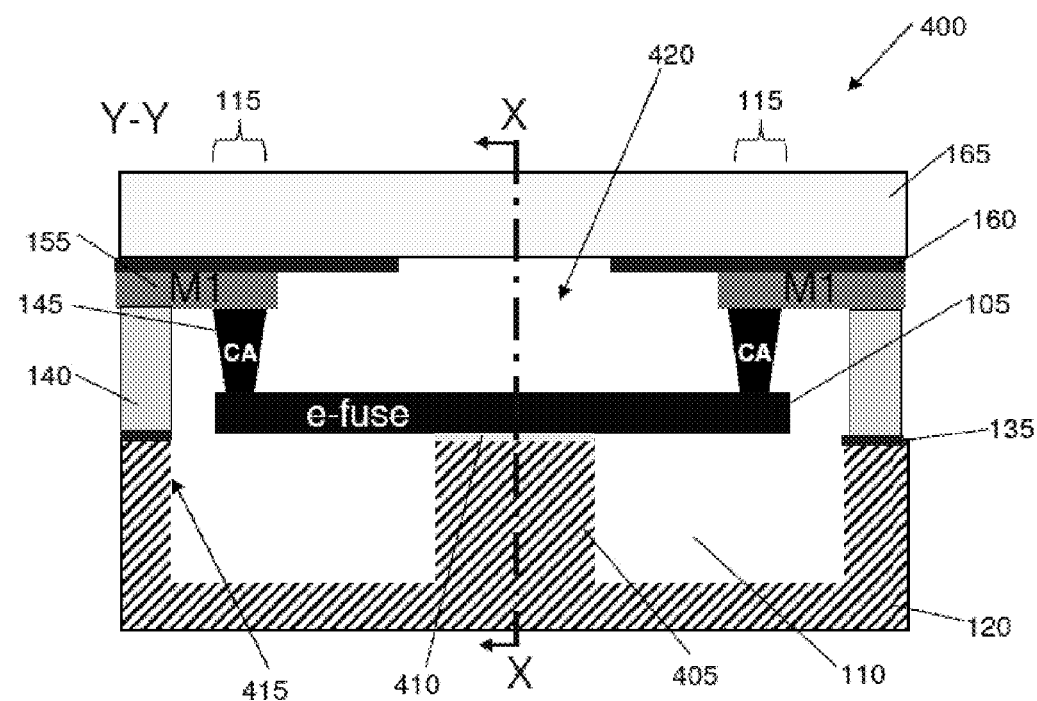
FIGS. 17 and 18 show sectional views of an exemplary structure in accordance with additional aspects of the invention.
Figure 18:
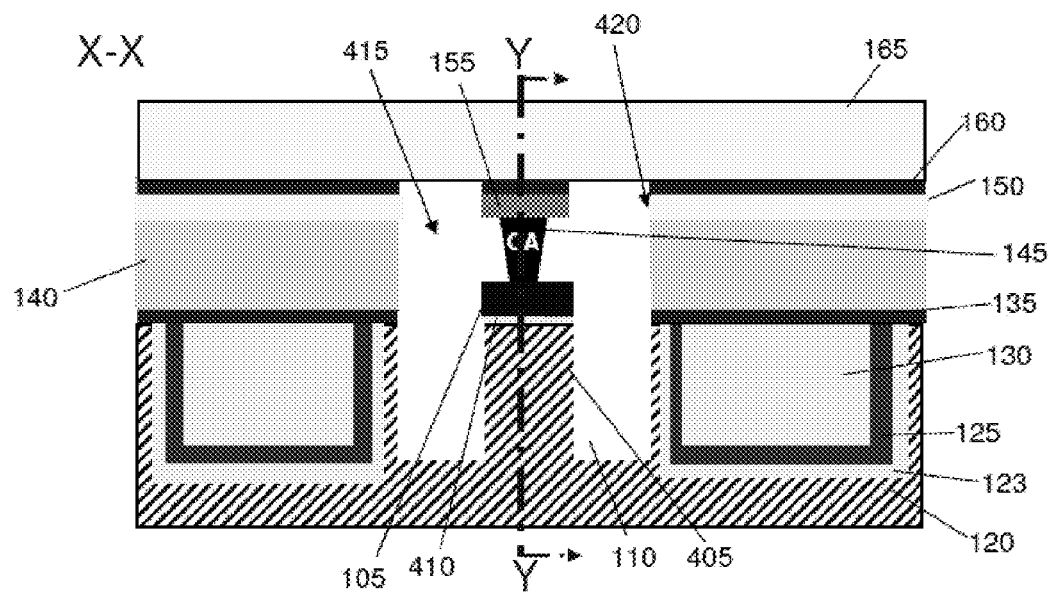

FIGS. 17 and 18 show sectional views X-X and Y-Y of an exemplary fuse structure 400 in accordance with further aspects of the invention, and FIGS. 19-24 show exemplary intermediate structures and processes used to form the fuse structure 400. To illustrate the sectional view of FIG. 17 more clearly, the portions of the substrate 120, the SiN layer 135, the BPSG layer 140, the SiO₂ layer 150 and the cap layer 160 on sidewall 420 (as indicated in FIGS. 17 and 18) are not shown. To illustrate the sectional view of FIG. 18 more clearly, the portions of the substrate 120, the SiN layer 135, the BPSG layer 140, the SiO₂ layer 150 and the cap layer 160 on sidewall 415 (as indicated in FIGS. 17 and 18) are not shown.

As shown in FIG. 17, with the fuse structure 400, a plateau 405 is provided in the air gap 110, such that the e-fuse 105 is supported by the plateau 405 and the e-fuse's connections to the contacts 145. Moreover, in accordance with aspects of the invention, the plateau 405 provides an additional stress point for programming (e.g., breaking) the e-fuse. While the plateau 405 is illustrated as having a particular width and depth, it should be understood that the invention contemplates that the plateau 405 may be wider or narrower than illustrated in FIGS. 17 and 18. As shown on FIGS. 17 and 18, in embodiments, a gate dielectric layer 410 may be formed on the plateau 405 (as described further below), such that the e-fuse 105 is formed on the gate dielectric layer 410. As such, with fuse structure 400, the mechanical anchors 115 towards the end regions of the e-fuse 105 comprise the contacts 145. As shown in FIG. 18, the e-fuse 105 is surrounded by the air gap 110 and a portion of the e-fuse is supported by the plateau 405 (with the gate dielectric layer 410 there between).

Figure 19:
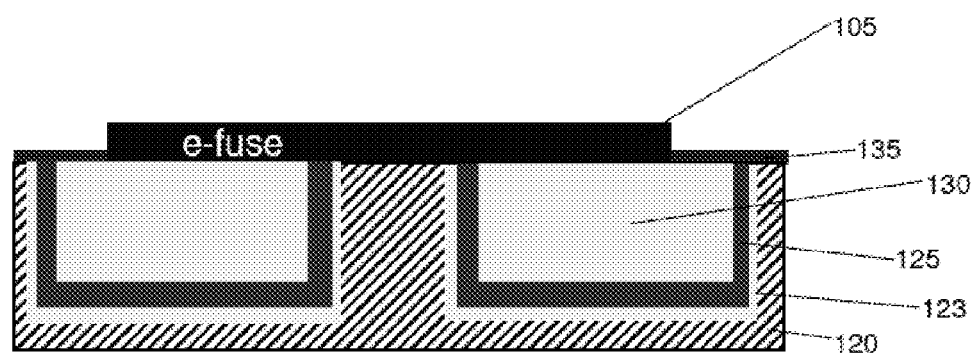
FIGS. 19-24 show exemplary processing steps and related structures used to form the exemplary structure shown in FIGS. 17 and 18 in accordance with aspects of the invention.

FIG. 19 shows an intermediate structure and processing steps used to form exemplary fuse structure 400 in accordance with aspects of the invention. As shown in FIG. 19, a substrate 120, e.g., a silicon substrate, is provided. Using conventional lithographic and etching processes, trenches (not labeled) are formed in the substrate 120 with a portion of the substrate 120 there between (which will form the plateau 405). An SiO₂ layer 123 is deposited in the trenches using conventional deposition techniques. A mechanical hard layer 125, e.g., silicon nitride (SiN), is deposited in the trenches on the SiO₂ layer 123 using conventional deposition techniques. While not illustrated in FIG. 19, it should be understood that the SiO₂/SiN liner (i.e., the SiO₂ layer 123 and the SiN layer 125) is optional.

Additionally, as shown in FIG. 19, a layer of silicon dioxide (SiO₂) 130 is deposited in the trenches above the SiN layer 125 using conventional deposition techniques well understood by those of ordinary skill in the art to form a shallow trench isolations (STI) (not labeled) comprising the SiO₂ layer 130, the SiN layer 125 and the SiO₂ layer 123. The SiO₂ layer 130, the SiN layer 125 and the SiO₂ layer 123 are planarized using conventional polishing techniques well understood by those of ordinary skill in the art, e.g., a chemical-mechanical polish (CMP) process.

Furthermore, as shown in FIG. 19, a gate conductor layer (a portion of which will become the e-fuse 105) is formed above the substrate 120, portions of the SiO₂ layer 123, the SiN layer 125 and the SiO₂ layer 130. While not illustrated in FIG. 19, a dielectric layer may be deposited on the substrate 120, portions of the SiO₂ layer 123, the SiN layer 125 and the SiO₂ layer 130, and etched using conventional lithographic and etching processes to form the gate dielectric layer 410 (shown in FIGS. 17 and 18) prior to forming the gate conductor layer. Conventional lithographic and etching processes, e.g., a reactive ion etch (RIE), are used to pattern the gate conductor layer to form the e-fuse 105 (which, as would be understood by those of ordinary skill in the art, is also the gate conductor). Additionally, spacers, junctions and a silicide are formed in respective conventional manners well understood by those of ordinary skill in the art. Further, as shown in FIG. 19, a SiN layer 135 is deposited on portions of the SiO₂ layer 130, portions of the SiN layer 125, portions of the SiO₂ layer 123 and the substrate 120 not covered by the e-fuse 105 using conventional lithography and deposition processes.

Figure 20:
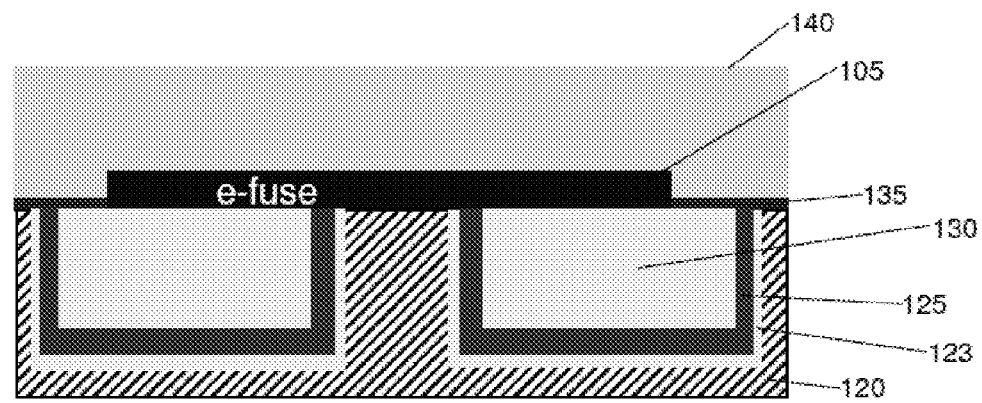

As shown in FIG. 20, an ILD layer, e.g., a borophosphosilicate glass (BPSG) layer 140, is deposited over the SiN layer 135 and the e-fuse 105, using a conventional deposition process.

Figure 21:
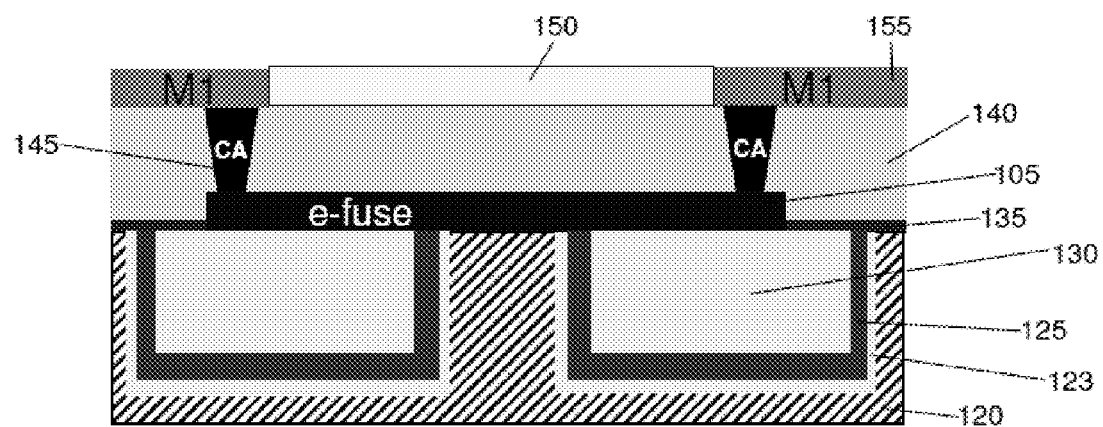

As shown in FIG. 21, contact holes (not labeled) are formed in the BPSG layer 140 down to the e-fuse 105 using conventional photolithography and etching processes (e.g., an RIE). Contacts 145 are deposited in the contact holes in contact with the e-fuse 105. In embodiments, the contacts 145 may comprise Ti, TiN or W, amongst other suitable materials. As additionally shown in FIG. 21, the contacts 145 are polished using conventional methods, e.g., a CMP.

An SiO₂ layer 150 is deposited on the BPSG layer 140 and the contacts 145 using a conventional deposition method, e.g., a plasma enhanced chemical vapor deposition (PECVD). The SiO₂ layer 150 is etched using conventional photolithography and etching processes, e.g., RIE, to form trenches (not labeled), in which the M1 layer 155 is deposited. In embodiments, a carbon doped SiO₂ layer, e.g., SiCOH, or BPSG may be used in place of the SiO₂ layer 150. Subsequently, the M1 layer 155 is deposited in the trenches formed in the SiO₂ layer 150, as shown in FIG. 21. In embodiments, the M1 layer may comprise Ta and/or Cu, amongst other suitable materials.

Figure 22:
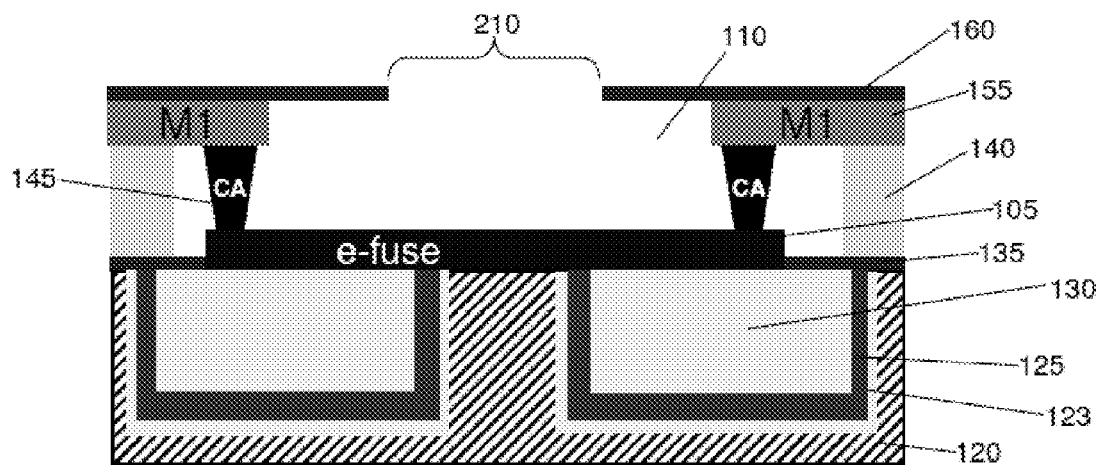

As shown in FIG. 22, a cap layer 160, e.g., a SiCN or SiN layer, is deposited over the M1 layer 155 and the SiO₂ layer 150 using conventional deposition processes (e.g., a PECVD). Additionally, an air gap 110 is partially formed around the e-fuse 105. More specifically, conventional lithography and etching processes (e.g., a masking process and an RIE) are used to provide an opening 210 in the cap layer 160. Further, with the exemplary intermediate structure of FIG. 22, an isotropic etch (e.g., BHF+CH₄/O₂+BHF) may be used to etch the SiO₂ layer 150 and portions of the BPSG layer 140, such that a portion of the air gap 110 is provided above the e-fuse 105.

Figure 23:
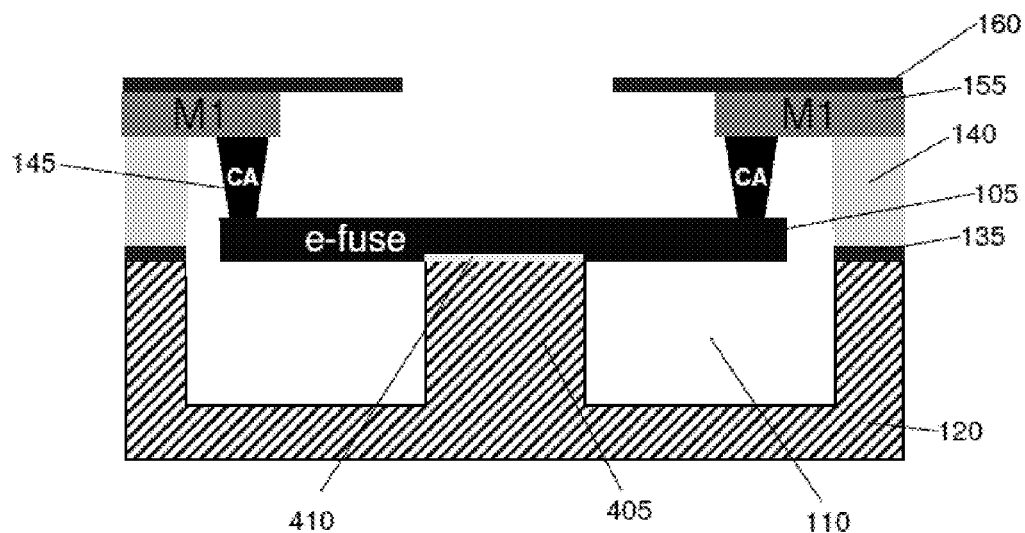

As shown in FIG. 23, an isotropic etch (e.g., BHF+CH₄/O₂+BHF) is used to etch the portions of the SiN layer 135, the SiO₂ layer 130, the SiN layer 125 and the SiO₂ layer 123 to form the air gap 110. In comparison to the fuse structure 100 of FIG. 1, with the exemplary fuse structure 400, the air gap 110 is larger both above and below the e-fuse, such that the contacts 145 and the e-fuse 105 are exposed. While with this exemplary fuse structure 400, the etching to form the air gap 110 has been described as a plurality of etches, those ordinarily skilled in the art will readily understand that one etching step and/or one etchant may be used to form the air gap 110.

Figure 24:
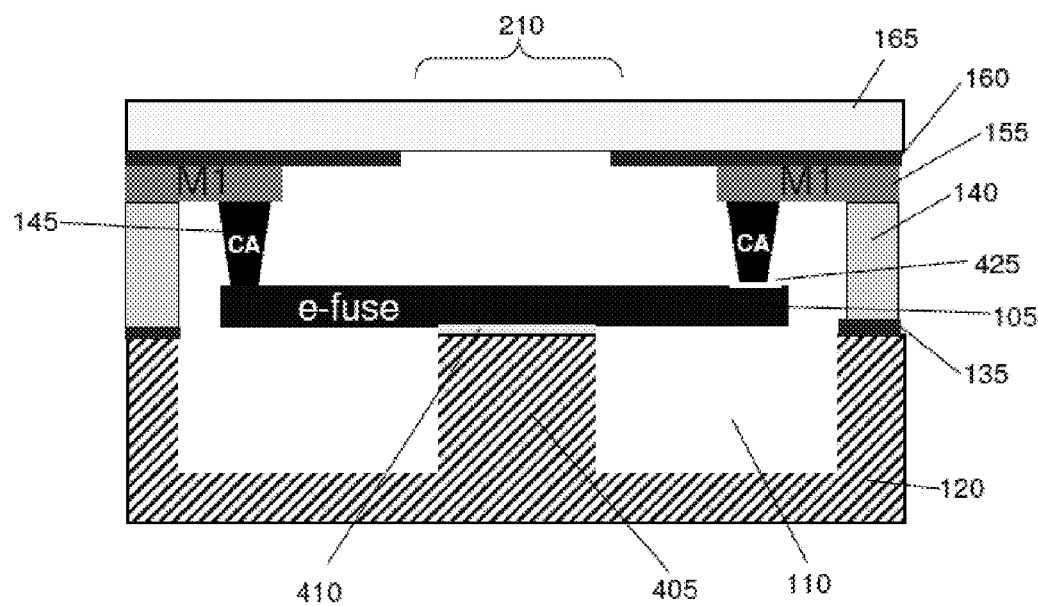

As shown in FIG. 24, an interlevel dielectric layer 165 is deposited on the cap layer 160 and covering the opening 210 using, e.g., a PECVD process. In embodiments, the interlevel dielectric layer 165 may comprise SiCOH, SiO₂, a low-k material or an ultra low-k material, amongst other suitable materials. Additionally, as illustrated in FIG. 24, the e-fuse 105 has been programmed. That is, the right contact 145 is no longer in contact with the e-fuse 105 due to stress during a thermal cycle, which caused a crack 425 at the interface of the contact 145 and the e-fuse 105.

In accordance with further aspects of the invention, the material (or materials) for the e-fuse 105 may be selected in part based upon a coefficient of thermal expansion of the e-fuse material and/or the coefficient of thermal expansion of the other materials of the fuse structure. Additionally, the material of the e-fuse 105 may be selected based in part upon the elastic modulus of the e-fuse material. Table 1 lists exemplary fuse structure materials with their respective coefficients of thermal expansion and elastic modules.

TABLE 1

| Materials | CTE (PPM/C) | Elastic Modules (GPa) |
| --- | --- | --- |
| SiO₂ | 0.5 | 70 |
| HfO₂ | 1.0 | 380 |
| TiN | 9.3 | 251 |
| Si | 2.3 | 150 |

In accordance with aspects of the invention, the e-fuse material should be selected to have a different coefficient of thermal expansion (CTE) than, e.g., the substrate. For example, if the substrate comprises Si (having a CTE of 2.3), than TiN (having a CTE of 9.3) may be selected as the fuse material. Additionally, for example, if the e-fuse material has lower elastic modulus (i.e., is less stiff), a smaller mechanical force (or stress) will be sufficient to program (e.g., rupture) the e-fuse 105, when the e-fuse 105 reaches its mechanical strength. Additionally, an e-fuse comprising brittle materials may be programmable with less mechanical force as compared an e-fuse comprising ductile materials. As such, brittle materials may be better suited for an e-fuse material as compared to ductile materials.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

Design Flow

Figure 25:
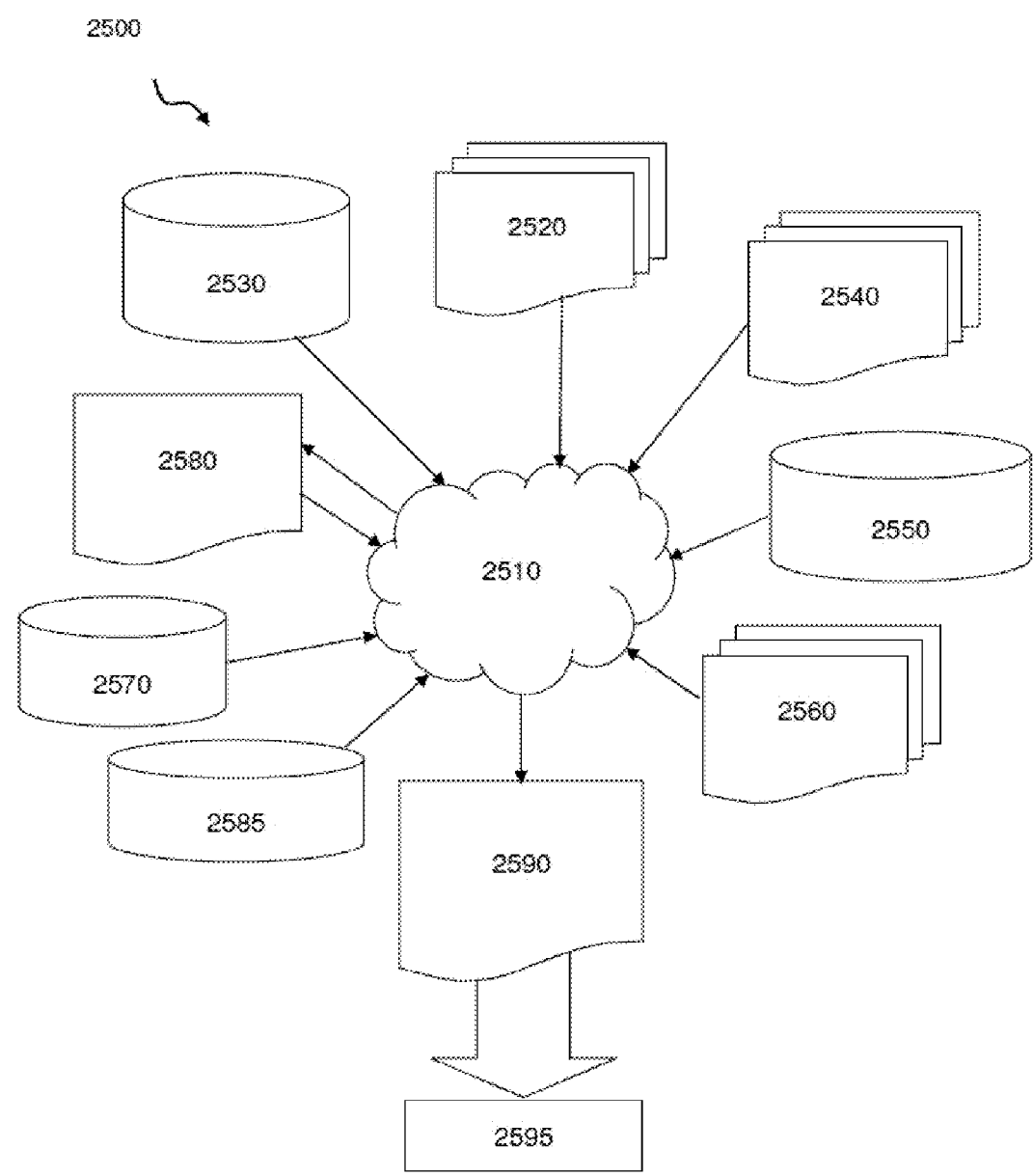
FIG. 25 is a flow diagram of a design process used in semiconductor design, manufacturing, and/or testing.

FIG. 25 shows a block diagram of an exemplary design flow 2500 used for example, in semiconductor design, manufacturing, and/or test. Design flow 2500 may vary depending on the type of IC being designed. For example, a design flow 2500 for building an application specific IC (ASIC) may differ from a design flow 2500 for designing a standard component or from a design from 2500 for instantiating the design into a programmable array, for example a programmable gate array (PGA) or a field programmable gate array (FPGA) offered by Altera® Inc. or Xilinx® Inc. (Altera is a registered trademark of Altera Corporation in the United States, other countries, or both. Xilinx is a registered trademark of Xilinx, Inc. in the United States, other countries, or both.) Design structure 2520 is preferably an input to a design process 2510 and may come from an IP provider, a core developer, or other design company or may be generated by the operator of the design flow, or from other sources. Design structure 2520 comprises an embodiment of the invention as shown in FIGS. 1, 8-11, 17 and 18 in the form of schematics or HDL, a hardware-description language (e.g., VERILOG®, Very High Speed Integrated Circuit (VHSIC) Hardware Description Language (VHDL), C, etc.). (VERILOG is a registered trademark of Cadence Design Systems, Inc. in the United States, other countries, or both.) Design structure 2520 may be contained on one or more machine readable medium. For example, design structure 2520 may be a text file or a graphical representation of an embodiment of the invention as shown in FIGS. 1, 8-11, 17 and 18. Design process 2510 preferably synthesizes (or translates) an embodiment of the invention as shown in FIGS. 1, 8-11, 17 and 18 into a netlist 2580, where netlist 2580 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 2580 is resynthesized one or more times depending on design specifications and parameters for the circuit.

Design process 2510 may include using a variety of inputs; for example, inputs from library elements 2530 which may house a set of commonly used elements, circuits, and devices, including models, layouts, and symbolic representations, for a given manufacturing technology (e.g., different technology nodes, 32 nm, 45 nm, 90 nm, etc.), design specifications 2540, characterization data 2550, verification data 2560, design rules 2570, and test data files 2585 (which may include test patterns and other testing information). Design process 2510 may further include, for example, standard circuit design processes such as timing analysis, verification, design rule checking, place and route operations, etc. One of ordinary skill in the art of integrated circuit design can appreciate the extent of possible electronic design automation tools and applications used in design process 2510 without deviating from the scope and spirit of the invention. The design structure of the invention is not limited to any specific design flow.

Design process 2510 preferably translates an embodiment of the invention as shown in FIGS. 1, 8-11, 17 and 18, along with any additional integrated circuit design or data (if applicable), into a second design structure 2590. Design structure 2590 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 2590 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 8-11, 17 and 18. Design structure 2590 may then proceed to a stage 2595 where, for example, design structure 2590: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method of forming a programmable fuse structure, comprising:
    forming at least one shallow trench isolation (STI) in a substrate;
    forming an e-fuse over the at least one STI;
    depositing an interlevel dielectric (ILD) layer over the e-fuse;
    removing at least a portion of the at least one STI under the e-fuse to provide an air gap below a portion of the e-fuse; and
    removing at least a portion of the ILD layer over the e-fuse to provide the air gap above the portion of the e-fuse.

2. The method of claim 1, wherein the air gap at least one of:
    reduces accumulated stress on the e-fuse;
    increases a heating rate of the e-fuse during programming;
    minimizes heating of neighboring structures; and minimizes mechanical constraint of the e-fuse.

3. The method of claim 1, wherein the programmable fuse structure comprises a multi-layer material stack, wherein the e-fuse comprises a material having a different coefficient of thermal expansion (CTE) than a material of the substrate.

4. The method of claim 1, further comprising providing a metal layer above the ILD layer and contacts in the ILD layer electrically connecting the metal layer and the e-fuse.

5. The method of claim 4, further comprising providing mechanical anchors for ends of the e-fuse to assist mechanical rupture programming.

6. The method of claim 5, wherein the mechanical anchors comprise portions of the ILD layer.

7. The method of claim 5, wherein the mechanical anchors comprise the contacts.

8. The method of claim 4, further comprising:
depositing a cap layer over the metal layer;
etching an opening in the cap layer;
etching at least a portion of the ILD layer through the opening to remove at least the portion of the ILD layer over the e-fuse; and
etching at least a portion of the at least one STI through the opening to remove at least the portion of the at least one STI under the e-fuse.

9. The method of claim 8, further comprising depositing a dielectric layer over the cap layer and the opening in the cap layer, wherein the dielectric layer comprises at least one of silicon dioxide, silicon carbide, a low-K material, and an ultra-low-K material.

10. The method of claim 1, further comprising providing a mechanical hard layer in the at least one STI to absorb stress relaxation resulting from fuse programming.

11. The method of claim 1, wherein the at least one STI comprises silicon dioxide.

12. The method of claim 1, wherein the at least one STI comprises silicon dioxide and a silicon nitride/silicon dioxide liner layer.

13. The method of claim 1, further comprising providing a plateau in the substrate upon which a portion of the e-fuse is formed, which is structured and arranged to provide a stress point for fuse programming.

14. A method of manufacturing a programmable fuse comprising:
forming at least one shallow trench isolation (STI) in a substrate;
forming an e-fuse over the at least one STI;
depositing an interlevel dielectric (ILD) layer over the e-fuse;
removing at least a portion of the ILD layer over the e-fuse to provide an air gap above a portion of the e-fuse;
removing at least a portion of the at least one STI under the e-fuse to provide the air gap below the portion of the e-fuse; and
providing a metal layer above the ILD layer and contacts in the ILD layer electrically connecting the metal layer and the e-fuse.

15. The method of claim 14, wherein the programmable fuse comprises a multi-layer material stack, wherein the e-fuse comprises a material having a different coefficient of thermal expansion (CTE) than a material of the substrate.

16. The method of claim 14, wherein the programmable fuse is programmed by:
thermally straining the e-fuse via electrical flow through the metal layer, the contacts and the e-fuse; and
rupturing the e-fuse through the thermal straining to program the programmable fuse.

17. The method of claim 14, further comprising providing mechanical anchors for ends of the e-fuse to assist mechanical rupture programming, wherein the mechanical anchors comprise at least one of portions of the ILD layer and the contacts.

18. The method of claim 14, further comprising:
depositing a cap layer over the metal layer;
etching an opening in the cap layer;
etching at least a portion of the ILD layer through the opening to remove at least the portion of the ILD layer over the e-fuse;
etching at least a portion of the at least one STI through the opening to remove at least the portion of the at least one STI under the e-fuse; and
depositing a dielectric layer over the cap layer and the opening in the cap layer, wherein the dielectric layer comprises at least one of silicon dioxide, silicon carbide, a low-K material, and an ultra-low-K material.

19. The method of claim 14, further comprising providing a plateau in the substrate upon which a portion of the e-fuse is formed, wherein the plateau provides a stress point during the programming.

* * * * *